United States Patent [19]
Su

[11] Patent Number: 5,847,602
[45] Date of Patent: Dec. 8, 1998

[54] METHOD AND APPARATUS FOR LINEARIZING AN EFFICIENT CLASS D/E POWER AMPLIFIER USING DELTA MODULATION

[75] Inventor: David Su, Mountain View, Calif.

[73] Assignee: Hewlett-Packard Company, Palo Alto, Calif.

[21] Appl. No.: 811,090

[22] Filed: Mar. 3, 1997

[51] Int. Cl.⁶ .................................................. H03F 3/38
[52] U.S. Cl. .................. 330/10; 330/207 A; 330/297
[58] Field of Search .............................. 330/10, 207 A, 330/251, 124 R, 127, 297

[56] References Cited

U.S. PATENT DOCUMENTS

| 4,831,334 | 5/1989 | Hudspeth et al. | 330/10 |
| 5,365,187 | 11/1994 | Hornak et al. | 330/10 |

FOREIGN PATENT DOCUMENTS 0 385 641  9/1990  European Pat. Off. .

OTHER PUBLICATIONS

Kahn, Leonard, R., "Single-Sideband Transmission by Envelope Elimination and Restoration", Proceedings of the I.R.E., Jul. 1952, pp. 803–806.

Koch M. J. and Fisher R. E., "A High Efficiency 835 MHz Linear Power Amplifier for Digital Cellular Telephony", Proceedings of the 39th IEEE Vehicular Technology Conference, May 1989, pp. 17–18.

Sokal, Nathan O, and Sokal, Alan D. "Class E–A New Class of High–Efficiency Tuned Single–Ended Switching Power Amplifiers", IEEE Journal of Solid–State Circuits, vol. SC–10, No. 3, Jun. 1975, pp. 168–176.

*Primary Examiner*—Steven Mottola

[57] ABSTRACT

A delta-modulated magnitude amplifier is used to amplify the magnitude component of an RF power amplifier that employs envelope elimination and restoration. The delta-modulated amplifier introduces a smaller amount of non-linearity than traditional approaches, which are based upon pulse-width modulation. The disclosed technique can be implemented using switched-capacitor circuits in a standard MOS technology with only two external components, i.e., an inductor and a capacitor. Thus, the disclosed technique allows the implementation of an efficient and yet linear RF power amplifier using low-cost MOS technology.

20 Claims, 2 Drawing Sheets

METHOD AND APPARATUS FOR LINEARIZING AN EFFICIENT CLASS D/E POWER AMPLIFIER USING DELTA MODULATION

BACKGROUND OF THE INVENTION

1. Technical Field

The invention relates to power amplifiers. More particularly, the invention relates to a method and apparatus for linearizing a power amplifier.

2. Description of the Prior Art

The efficiency of an RF power amplifier has a significant impact on the battery life of a portable device, such as a portable transmitter, because the amplifier typically consumes the most amount of power used by the device. Efficient power amplifiers are therefore highly desirable for portable transmitters. Efficient class C, D, E, and F power amplifiers are only capable of generating constant-amplitude outputs. However, many recent transmitter designs require a non-constant amplitude RF output to maximize the data rate within a given channel bandwidth.

A suitable linear RF amplifier may be manufactured using gallium arsenide devices. However, gallium arsenide devices are presently considered too expensive for many applications. While MOS is the preferred process for manufacturing semiconductor devices, due to its low cost of fabrication and high yields, MOS has traditionally been unsuitable for fabricating linear RF amplifiers due to its lack of linearity when used to implement a high efficiency amplifier. Such poor linearity introduces a significant amount of distortion into the amplifier's output signal. Many different linearization schemes have been proposed in the art to achieve a linear and efficient power amplifier.

The design of traditional linear power amplifiers normally involves a trade-off between efficiency and linearity. Polar modulation is a technique known in the art that simultaneously achieves linearity and efficiency in an RF power amplifier. Polar modulation is also known as envelope elimination and restoration (EER). In this approach, an RF input signal is decomposed into its polar components, i.e., phase and magnitude. These two polar components are amplified independently and are then recombined to generate an amplified, linear RF output signal. The phase component of the RF input signal is typically amplified by a constant-amplitude amplifier that is optimized for efficiency. The magnitude or envelope component of the RF input signal is typically amplified by a switching-mode power supply that operates as the power supply for at least the output stage of the constant-amplitude amplifier.

Various approaches to the use of polar modulation have been described by L. Kahn, *Single-Sided Transmission by Envelope Elimination and Restoration*, Proc. IRE, July 1952, pp. 803–806; and by M. Koch, R. Fisher, *a High-Frequency 835 MHz Linear Power Amplifier for Digital Cellular Telephony*, 39th IEEE Vehicular Technology Conference, 3 May 1989.

FIG. 1 is a block schematic diagram of a traditional RF amplifier 10 that employs the above-described envelope elimination and restoration technique. In the amplifier shown in FIG. 1, an RF input signal 12 is first decomposed into its polar components. These polar components comprise phase, which is a constant-amplitude signal, and magnitude, which is a low-frequency envelope signal. The phase and magnitude components are amplified independently along separate paths 15 and 11, respectively. The phase and magnitude components are then recombined to generate the linearly-amplified RF output signal 19.

The phase component is extracted from the RF input signal by the limiter 16, and is amplified by an efficient constant-amplitude amplifier that may comprise the nonlinear preamplifier 17, and the efficient, non-linear phase output stage 18. The magnitude component, which has a bandwidth comparable with the channel bandwidth, is extracted from the RF input signal by the envelope detector 13, and is amplified by the linear baseband amplifier 14. To maximize efficiency, the linear baseband amplifier 14 is implemented using a switching-mode power supply having a class-D amplifier as its output stage.

Existing implementations of switching-mode power supplies use pulse width modulation. The output of such a power supply is a square wave whose mark/space ratio represents the magnitude component of the RF input signal. However, using pulse width modulation to amplify the magnitude component introduces intermodulation distortion into the RF output.

It is therefore desirable to provide a high efficiency RF amplifier that can be fabricated using a low-cost process, such as MOS, and that provides linear amplification of the RF input signal.

SUMMARY OF THE INVENTION

The RF power amplifier herein described has two separate amplification paths, i.e., a magnitude amplification path for the magnitude component of the RF input signal and a phase amplification path for the phase component of the RF input signal. The phase amplification path of the amplifier includes a phase output stage, which is preferably a highly-efficient Class D, Class E or Class F output stage. The magnitude amplification path includes a delta-modulated magnitude amplifier that amplifies the amplitude component. The delta-modulated magnitude amplifier includes a clocked difference detector, a highly-efficient but non-linear Class D amplifier, a local decoder, e.g., a low-pass filter, and a negative feedback path. The output of the class D amplifier is applied through the local decoder to the power supply input terminal of the phase output stage, and amplitude modulates the RF output signal generated by the phase output stage.

The negative feedback path feeds the RF output signal generated by the RF power amplifier back to the clocked difference detector via an envelope detector and attenuator. The attenuator sets the gain of the delta-modulated magnitude amplifier. The negative feedback loop corrects any difference between the magnitude component of the RF input signal and the magnitude component of the RF output signal resulting from non-linearities in the delta-modulated transform amplifier and the phase output stage.

The output of the Class D amplifier of the delta-modulated magnitude amplifier is a two-level waveform that represents the magnitude component of the RF input signal. The local decoder extracts the magnitude component of the RF input signal from the output signal of the Class D amplifier, and applies the resulting amplified magnitude component to the power supply input terminal of the phase output amplifier. Amplification of the magnitude component is linearized by the negative feedback path.

DETAILED DESCRIPTION OF THE INVENTION

Figure 1:
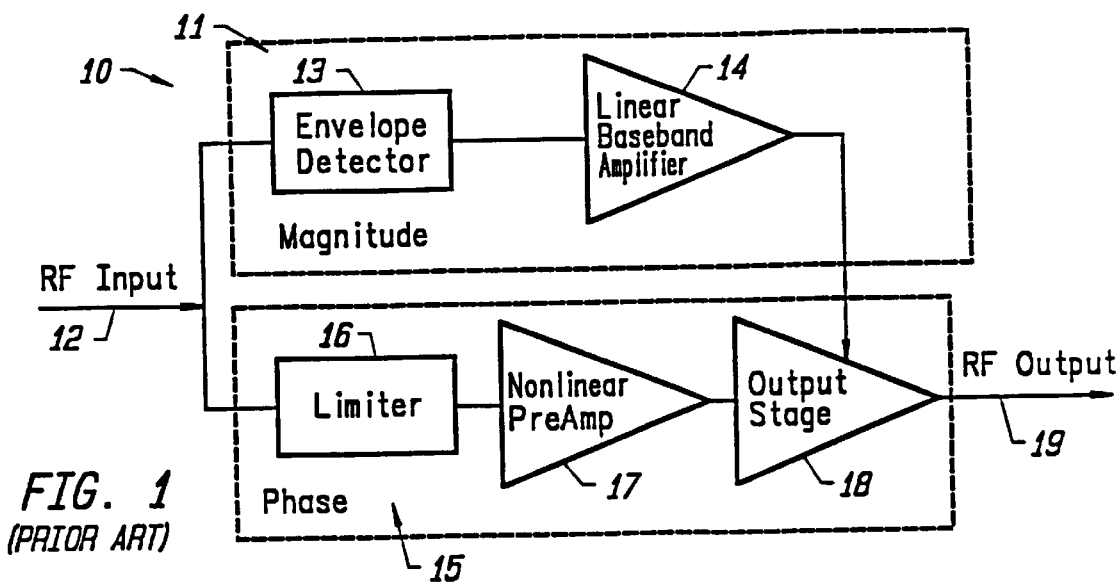
FIG. 1 is a block schematic diagram of a conventional RF amplifier employing envelope elimination and restoration.

The invention provides an efficient, highly linear RF power amplifier that is based, in part, upon the polar modulation concept discussed above in connection with FIG. 1. The preferred embodiment of the invention includes a phase amplification path in which the constant-amplitude phase component of the RF input signal is amplified. The phase amplification path includes a highly-efficient, non-linear phase output stage that may be a Class C output stage, a Class D output stage, a form of Class E output stage or a class F output stage. Any highly-efficient power amplifier whose output amplitude linearly tracks the applied power supply voltage can be used. The magnitude component of the RF input signal is amplified in a separate magnitude amplification path in which a unique, efficient delta-mudulate magnitude amplifier amplifies the magnitude component. The output stage of the delta-modulated magnitude amplifier is preferably a highly-efficient, non-linear class D amplifier that provides the power supply voltage for the phase output stage. The amplified magnitude component output by the delta-modulated magnitude amplifier amplitude modulates the RF output signal generated by the phase output stage by varying the power supply voltage of the phase output stage.

The pulse width modulation scheme employed by prior art polar modulation systems produces an RF output signal that is not as linear as the RF output signal produced with the aid of the delta-modulated magnitude amplifier. Thus, the invention provides an equally efficient, but substantially lower distortion, modulation scheme than that provided by pulse width modulation.

Figure 2:
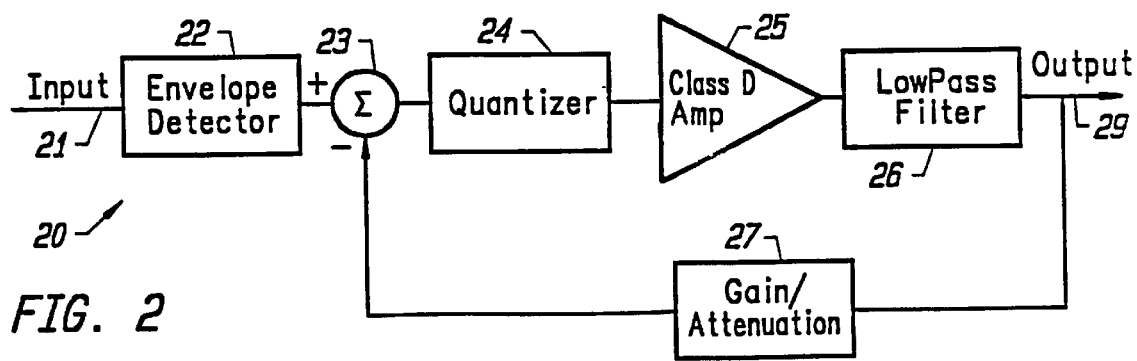
FIG. 2 is a simplified block schematic diagram of the delta-modulated magnitude amplifier according to the invention.

FIG. 2 is a simplified block schematic diagram of an embodiment of the delta-modulated magnitude amplifier 20 according to the invention. The delta-modulated magnitude amplifier shown in FIG. 2 is suitable for use in the magnitude amplification path of an RF power amplifier using polar modulation, such as that shown in FIG. 1. The RF input signal 21 is coupled to the envelope detector 22 which extracts the magnitude component from the RF input signal. The delta-modulated magnitude amplifier 20 includes the clocked difference detector 23, which will be described in greater detail below, the quantizer 24, the Class D amplifier 25, the low-pass filter 26, and the negative feedback loop 28 that includes the gain/attenuation stage 27.

The clocked difference detector 23 and the quantizer 24 collectively generate a digital bit stream that represents the magnitude component of the RF input signal. In this embodiment of the invention, the Class D amplifier performs current amplification of the digital bit stream. The current amplification is required to enable the delta-modulated magnitude amplifier 20 to operate as the power supply for the phase output stage 18 shown in FIG. 1. The low-pass filter 26 acts as a local decoder for the digital bit stream present at the output of the Class D amplifier 25. The output of the low-pass filter thus provides the output signal 29 of the delta-modulated amplifier. This output signal is a linearly-amplified, high-current version of the magnitude component of the RF input signal.

The amplifier output signal 29 of the delta-modulated amplifier 20 is connected to the negative feedback path 28 that includes the gain/attenuation stage 27. The gain/attenuation stage amplifies or attenuates the amplifier output signal to provide a feedback signal whose level is substantially commensurate with that of the signal developed by the envelope detector 22. The gain or attenuation provided by the gain/attenuation stage sets the voltage loss or gain provided by the delta-modulated magnitude amplifier 20. In a practical embodiment, the delta-modulated magnitude amplifier is given an overall voltage gain by the gain/attenuation stage attenuating the amplifier output signal.

The signal from the envelope detector and the feedback signal from the gain/attenuation stage provide differential inputs to the difference detector 23. Any difference between the output signal of the envelope detector 22 and the feedback signal is detected by the difference detector. The sign of the difference signal, i.e., whether the feedback signal is greater than or less than the output signal of the envelope detector, determines whether the difference detector and the quantizer 23 collectively add a 1 or a 0 to the digital bit stream. The difference detector and the quantizer collectively add a 1 or a 0 to the digital bit stream in such a sense that, when the digital bit stream is decoded by the local decoder, the amplitude of the amplified magnitude signal is changed in a manner that reduces the difference. This way, the amplified magnitude signal generated by the delta-modulated amplifier accurately and linearly tracks the magnitude component of the RF input signal.

Figure 3:
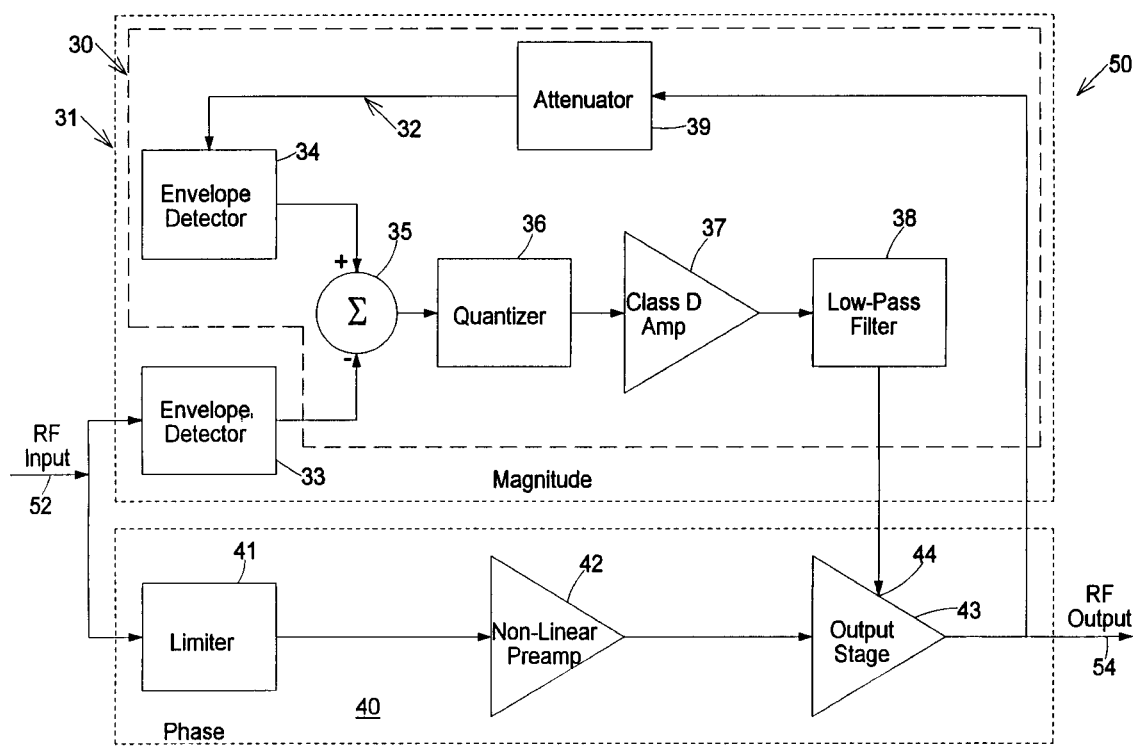
FIG. 3 is a more detailed block schematic diagram of an RF amplifier employing the delta modulated amplifier according to the invention.

FIG. 3 is a more detailed block schematic diagram of an RF amplifier 50 that includes the delta-modulated magnitude amplifier 30 according to the invention. The delta-modulated amplifier 30 is similar to the delta-modulated amplifier 20 described above with reference to FIG. 2 except for the arrangement of the negative feedback path 32. The RF input signal 52 is an amplitude modulated/phase modulated signal that is decomposed into a phase component and a magnitude component, as discussed above. The phase component is amplified in the phase amplification path 40 and the magnitude component is amplified in the separate magnitude amplification path 31.

The phase component is extracted from the RF input signal 52 by the limiter 41 which removes the magnitude component by limiting, i.e., clipping, the RF input signal. The output of the limiter is a constant-envelope signal having a phase that changes according to the phase of the RF input signal. The phase component thus produced is amplified by the non-linear preamplifier 42. A non-linear preamplifier is used because such a preamplifier is easier to design than a linear amplifier and there is no need to amplify the phase component linearly.

The output of the preamplifier 42 is fed to the phase output stage 43, which is also a non-linear amplifier. A non-linear amplifier is used because it provides substantially higher efficiency than a linear amplifier and, again, linearity is not an issue with regard to the phase component of the RF input signal 52. Any type of high-efficiency amplification scheme whose output amplitude linearly tracks the applied power supply voltage may be used successfully for the phase output stage. For example, any Class C, Class D, Class E or Class F amplifier may used, as appropriate, for the phase output stage. One preferred embodiment of the invention uses a variant of the Class E amplification scheme. See, for example, N. Sokal, A. Sokal, *Class E-A New Class of High-Efficiency Tuned Single-Ended Switching Power Amplifiers*, IEEE Journal of Solid-State Circuits, Vol. SC-10, No. 3, June 1975, pp. 168–176, and U.S. Pat. No. 3,919,656, issued 11 Nov., 1975. However, the choice of such amplification scheme is not considered essential to practice the invention.

As described above, the phase component of the RF input signal 52 is amplified in the phase amplification path 40. It is also necessary to amplify the modulation envelope of the RF input signal, i.e., the magnitude component of the RF input signal, and then to use the amplified magnitude component and the amplified phase component to construct the RF output signal. To do so, the RF input signal 52 is coupled to the envelope detector 33 which extracts the magnitude component by removing the phase component. The magnitude component of the RF input signal comprises low frequency information that must be amplified linearly. That is, the amplifier that amplifies the magnitude component must deliver the amount of current demanded by the phase output stage 43, while maintaining a linear voltage relationship between the voltage supplied to the phase component output stage and the output voltage of the envelope detector 33. The magnitude amplification path 31 according to the invention is configured to include the delta-modulated magnitude amplifier 30 that effects linear amplification of the magnitude component using delta modulation. The non-linear Class D amplifier 37 that serves as the output stage of the delta-modulated magnitude amplifier is driven by the output signal of the difference detector 35 via the quantizer 36. The difference detector receives as its input signals the outputs of the envelope detectors 33 and 34. The state of the output signal of the difference detector depends on whether the output of the envelope detector 34 is greater than or less than that of the envelope detector 33.

The Class D amplifier 37, which may alternatively be a class E amplifier, and the amplification elements that drive this amplifier in the delta-modulated magnitude amplifier 30, are easily fabricated in MOS, but are highly non-linear. However, the negative feedback loop 32 that includes the attenuator 39 and the envelope detector 34 linearizes the non-linear amplification stages as well as the Class D amplifier. Although the input of the negative feedback loop can be connected to the output of the low-pass filter, as shown in FIG. 2, in which case the envelope detector 34 is omitted, the input of the negative feedback loop 32 is connected to the RF output signal 54 in the preferred embodiment. This way, the negative feedback loop enables the delta-modulated magnitude amplifier to provide a linear voltage amplification between the output of the envelope detector 33 and the envelope component of the RF output signal 54 notwithstanding the non-linearity of the Class D amplifier 37 and the stages driving it. Connecting the negative feedback loop to the RF output signal also enables the negative feedback loop to correct any non-linearity in the transfer function of the phase output stage 43 between the power supply input voltage and the RF output signal envelope.

The preferred embodiment of the invention uses switched-capacitor circuits to implement both the difference detector 35 and the quantizer 36, although these elements are readily implemented in many different ways.

A conventional delta modulator includes a difference detector and quantizer that collectively generate a digital bit stream in response to a low-frequency input signal, a local decoder that locally decodes the digital bit stream, and a negative feedback loop connected between the output of the local decoder and the difference detector. Either or both the difference detector and the quantizer is clocked to determine the bit rate of the digital bit stream. In the preferred embodiment of the invention, the delta-modulated magnitude amplifier 30 comprises the difference detector 35 that generates an output voltage that depends on the difference between the outputs of the envelope detectors 33 and 34. The quantizer 36 generates the digital bit stream of the delta-modulated magnitude amplifier. The quantizer receives the output of the difference detector 35 and generates an output voltage that has one of two states, depending on whether the output voltage of the difference detector is greater than or less than a threshold level. The functions of the difference detector and quantizer may be combined in a single circuit element.

Either or both of the difference detector 35 and the quantizer 36 is clocked by a clock signal (not shown) whose frequency determines the bit rate of the digital bit stream. The output of the quantizer can only change state once per clock period. Hence, the digital bit stream generated by the quantizer is a series of 1s and 0s. In each clock period, the quantizer output is a 1 or a 0 depending on whether the output of the difference detector is above or below the threshold level. For example, the output of the difference detector at the beginning of each clock period may determine the state of the quantizer output in the clock period. Whether the quantizer adds a 1 or a 0 to the digital bit stream depends on the sign of the difference between the outputs of the envelope detectors 33 and 34, i.e., whether the feedback signal from the envelope detector 34 is greater than or less than the magnitude component from the envelope detector 33.

The frequency of the clock signal (not shown) that clocks either or both of the difference detector 35 and the quantizer 36 and determines the bit rate of the digital bit stream is several times that of the highest-frequency component of the low-frequency input signal. The clock signal frequency is preferably about one order of magnitude greater than that of the highest-frequency component of the input signal. The higher the clock signal frequency, the lower the quantizing noise that results when the digital bit stream is decoded to provide a decoded analog signal.

The output of the quantizer 36 is coupled to the Class D amplifier 37 which, in the preferred embodiment of the invention, is implemented by a CMOS inverter. The Class D amplifier receives the digital bit stream output by the quantizer and provides an output digital bit stream which has low and high voltage states that follow the 0s and 1s of the digital bit stream output by the quantizer. The Class D amplifier has a high-current output capable of providing the power supply current demand of the phase component output stage 43.

The delta-modulated magnitude amplifier 30 also comprises the low-pass filter 38 which, in the preferred embodiment of the invention is implemented by an external, second-order LC filter. The low-pass filter 38 acts as a local decoder for the digital bit stream output by the Class D amplifier 37. The local decoder receives the digital bit stream output by the Class D amplifier and decodes the digital bit stream to generate a decoded analog signal that is a current-amplified version of the output of the envelope detector 33. The decoded analog output may also be a voltage-amplified version of the output of the envelope detector. The output of the low-pass filter is connected to the power supply input terminal 44 of the phase output stage 43.

In a conventional delta modulator, the decoded analog signal generated by the local decoder is fed back to the difference detector, where it is compared with the input signal, as shown in FIG. 2. The difference detector varies the ratio of 1s to 0s in the digital bit stream to make the waveform of the decoded analog signal accurately match that of the input signal. As noted above, the decoded analog output signal from the output of the low-pass filter 38 may fed back to the difference detector, but in the preferred embodiment, the magnitude component of the RF output signal 54 extracted by the envelope detector 34 is fed back to the difference detector 35.

The negative feedback loop 32 between the RF output signal 54 and the envelope detector 34 includes the attenuator 39. The attenuator is provided in the feedback path to set the gain of the delta-modulated magnitude amplifier 30. The attenuator reduces the amplitude of the RF output signal so that it substantially equals the amplitude of the RF input signal. In the delta-modulated magnitude amplifier 30 in the preferred embodiment of the invention, the attenuator divides the output signal voltage by about 32 to provide the power amplifier 50 with about 30 dB of power gain.

The output of the attenuator 39 is coupled to the envelope detector 34, which is equivalent to the RF input envelope detector 33. In this way, the delta-modulated magnitude amplifier generates the envelope of the output RF signal detected by the envelope detector 34 to match the envelope of the RF input signal detected by the input envelope detector 33. If there is any difference between the envelope components of the RF input signal and the RF output signal, then such difference causes the difference detector 35 to modify the digital bit stream in a manner that cancels out the difference. Consequently, after an initial period of hunting, the linearity with which the envelope component of the RF input signal is amplified is almost absolute.

The amplified magnitude component at the output of the magnitude amplification path 31 is used as the power supply of the phase output stage 43. In the phase output stage, the amplified magnitude component of the RF input signal amplitude modulates the amplified phase component of the RF input signal to generate the phase- and amplitude-modulated RF output signal 54.

The delta-modulated amplifier 30 in the magnitude amplification path 31 can be implemented using standard CMOS technology. The difference detector and quantizer are discrete-time switched-capacitor circuits having offset cancellation. The Class D amplifier is a push-pull amplifier that is implemented using a chain of CMOS inverters. The low-pass filter 38 consists of one discrete inductor and one capacitor.

The negative feedback loop 32 of the delta-modulated magnitude amplifier 30 has two low frequency poles that are introduced by the second-order low-pass filter 38. This loop must be frequency compensated to ensure stability. Frequency compensation is accomplished by inserting a zero to cancel one of the low-frequency poles. The frequency zero is implemented using a discrete-time switched capacitor circuit having a z-domain transfer function of $(1-az^{-1})$. The discrete-time compensation circuit can be merged with the difference detector 35. Feedback loop stability can be achieved by using on-chip discrete-time switched capacitor circuits.

The efficiency of the amplification provided by the delta-modulated magnitude amplifier 30 in the magnitude amplification path is comparable to that of conventional switching-mode power supplies.

The use of the delta-modulated magnitude amplifier 30 in the magnitude amplification path 31 allows the implementation of an efficient, linear RF power amplifier in a low-cost CMOS technology. This approach is considered to be superior to conventional designs, which are based upon pulse-width modulation (discussed above). The use of the delta-modulated magnitude amplifier in the magnitude amplification path of a polar-modulated RF power amplifier provides a lower distortion RF output signal than a pulse width modulation-based design. The delta-modulated magnitude amplifier can be implemented using relatively simple and robust switched-capacitor circuits implemented using CMOS technology. The delta-modulated magnitude amplifier does not require a saw-tooth waveform generator, unlike a pulse width modulation-based scheme.

Although the invention is described with reference to the preferred embodiment, one skilled in the art will readily appreciate that other applications may be substituted for those set forth herein without departing from the scope of the present invention. Accordingly, the invention should only be limited by the claims set forth below.

I claim:

1. A linear power amplifier, comprising:
    a magnitude amplification path for a magnitude component of an input signal;
    a delta-modulated magnitude amplifier within said amplification path; and
    a phase amplification path for a phase component of said input signal, said phase component amplification path being coupled to said magnitude amplification path to receive an amplified magnitude component from said delta-modulated magnitude amplifier and, responsive to said amplified magnitude component and said phase component, generating an output signal that linearly relates in phase and amplitude to said input signal.

2. The linear power amplifier of claim 1, wherein said delta-modulated magnitude amplifier includes a Class D power amplifier.

3. The linear power amplifier of claim 1, wherein said delta-modulated magnitude amplifier comprises difference detecting means for comparing a magnitude component of said output signal with said magnitude component of said input signal.

4. The linear power amplifier of claim 3, additionally comprising:
    first envelope detecting means for detecting said magnitude component of said input signal, and for coupling said magnitude component to said difference detecting means; and
    second envelope detecting means for detecting said magnitude component of said output signal, and for coupling said magnitude component to said difference detecting means.

5. The linear power amplifier of claim 4, wherein said delta-modulated magnitude amplifier additionally comprises:
    a Class D amplifier; and
    a low pass filter.

6. The linear power amplifier of claim 1, wherein:
    the delta-modulated magnitude amplifier generates a digital bit stream; and
    the delta-modulated magnitude amplifier includes a second-order low-pass filter that acts as a local decoder for said digital bit stream.

7. The linear power amplifier of claim 1, wherein said phase amplification path includes a highly-efficient output stage having an output amplitude that is dependent upon said amplified magnitude component produced by said magnitude amplification path.

8. The linear power amplifier of claim 1, wherein said linear power amplifier is adapted for operation as an RF power amplifier.

9. An efficient, highly linear RF power amplifier, comprising:

a phase output stage that amplifies a phase component of an RF input signal to generate an RF output signal; and a delta-modulated magnitude amplifier connected as power supply for said phase output stage, said delta-modulated magnitude amplifier amplifying a magnitude component of said RF input signal by delta modulation to generate an amplified magnitude signal, said amplified magnitude signal amplitude modulating said RF output signal.

10. The power amplifier of claim 9, wherein:

said RF input signal comprises an amplitude modulated/phase modulated signal; and said power amplifier additionally comprises:

decomposing means for decomposing said RF input signal into phase and magnitude components, and a separate amplification path wherein each of said phase and magnitude components is amplified.

11. The power amplifier of claim 10, wherein said decomposing means includes limiter means for limiting said RF input signal to remove said magnitude component therefrom and for producing said phase component of the RF input signal as an output.

12. The power amplifier of claim 11, further comprising non-linear amplifier means for amplifying the output of said limiter means.

13. The power amplifier of claim 9, wherein said delta-modulated magnitude amplifier further comprises:

a difference detector for providing frequency compensation of a feedback loop by inserting a zero to cancel at least one low-frequency pole, said difference detector including a circuit having a z-domain transfer function of $(1-az^{-1})$.

14. The power amplifier of claim 13, wherein said phase output stage includes any one of a Class C, Class D, Class E and Class F amplifier.

15. The power amplifier of claim 9, further comprising envelope detector means, coupled to receive said RF input signal, for removing a phase component from said RF input signal.

16. The power amplifier of claim 9, wherein said delta-modulated magnitude amplifier includes:

envelope detecting means for detecting the envelope of said RF input signal;

feedback envelope detecting means for detecting the envelope of a feedback signal derived from said RF output signal;

difference detector means for generating a stream of bits each having a state that depends on the sign of the difference between the envelope of said RF input signal and the envelope of said feedback signal;

non-linear amplifier means for current amplifying said digital bit stream; and local decoder means for producing said amplified magnitude signal by decoding said digital bit stream output by said non-linear amplifier means.

17. The power amplifier of claim 16, wherein said non-linear amplifier means includes a Class D amplifier.

18. The power amplifier of claim 16, wherein said local decoder means includes a low-pass filter.

19. A method for efficient, highly linear RF power amplification, the method comprising steps of:

amplifying, using delta modulation, a magnitude component of an RF input signal to generate an amplified magnitude signal;

amplifying a phase component of said RF input signal to generate a phase-modulated RF output signal; and amplitude modulating said phase-modulated RF output signal using said amplified magnitude output signal to produce an amplitude- and phase-modulated RF output signal.

20. The method of claim 19, wherein said step of amplifying, using delta modulation, includes steps of:

detecting the envelopes of said RF input signal and of a feedback signal derived from said RF output signal;

generating a digital bit stream in which each bit has a state depending on the sign of a difference between the envelopes of said RF input signal and said feedback signal detected in said detecting step; and locally decoding said digital bit stream to produce said amplified magnitude signal.

* * * * *